(12) United States Patent
Matsushima (10) Patent No.: US 6,184,586 B1
(45) Date of Patent: Feb. 6, 2001

(54) SEMICONDUCTOR DEVICE INCLUDING A BALL GRID ARRAY

(75) Inventor: Hironori Matsushima, Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/066,581

(22) Filed: Apr. 27, 1998

(30) Foreign Application Priority Data

Aug. 28, 1997 (JP) .................................... 9-232534

(51) Int. Cl.$^7$ ............................ H01L 23/48; H01L 23/52; H01L 29/40
(52) U.S. Cl. ............................ 257/780; 257/778; 257/773; 257/775
(58) Field of Search .................................. 257/780, 781, 257/786, 778, 775, 773

(56) References Cited

U.S. PATENT DOCUMENTS

| 5,214,308 | * | 5/1993 | Nishhiguchi et al. . |
| 5,598,036 | * | 1/1997 | Ho . |
| 5,751,060 | * | 5/1998 | Laine et al. . |
| 5,828,128 | * | 10/1998 | Higashiguchi et al. . |

FOREIGN PATENT DOCUMENTS

| 7245360 | 9/1995 | (JP) . |
| 8125062 | 5/1996 | (JP) . |

* cited by examiner

Primary Examiner—Sheila V. Clark
(74) Attorney, Agent, or Firm—Leydig, Voit & Mayer, Ltd.

(57) ABSTRACT

A semiconductor device includes a multi-layered ball grid array (BGA) substrate with lines and a semiconductor chip having electrodes respectively connected with the lines by soldering bumps wherein the soldering bumps on the periphery of the semiconductor chip are larger in size than soldering bumps in a central portion of the semiconductor chip.

3 Claims, 7 Drawing Sheets

SEMICONDUCTOR DEVICE INCLUDING A BALL GRID ARRAY

BACKGROUND OF THE INVENTION

The present invention relates to a package construction of a semiconductor device. More particularly, the present invention relates to a package construction of a semiconductor having a BGA (Ball Grid Array) construction where soldering balls to be used for a soldering operation in the embodying of the semiconductor device into the product are provided in a matrix on the reverse face of a substrate.

The conventional semiconductor device comprises a BGA substrate, a semiconductor chip to be arranged on the BGA substrate, a heat spreader for dispersing externally the heat generated in the semiconductor chip, and a ring in a space between the BGA substrate and the heat spreader for splicing both of them. The BGA substrate has a multi-layer construction with a plurality of insulation layers being superposed on each other. A plurality of lines and via holes are provided in each of the insulation layers. The BGA substrates are mutually combined with a predetermined line through the via holes when a plurality of lines are superposed. A plurality of lines can be crossed through an insulation layer, thus realizing a smaller size of the semiconductor device.

Figure 6:
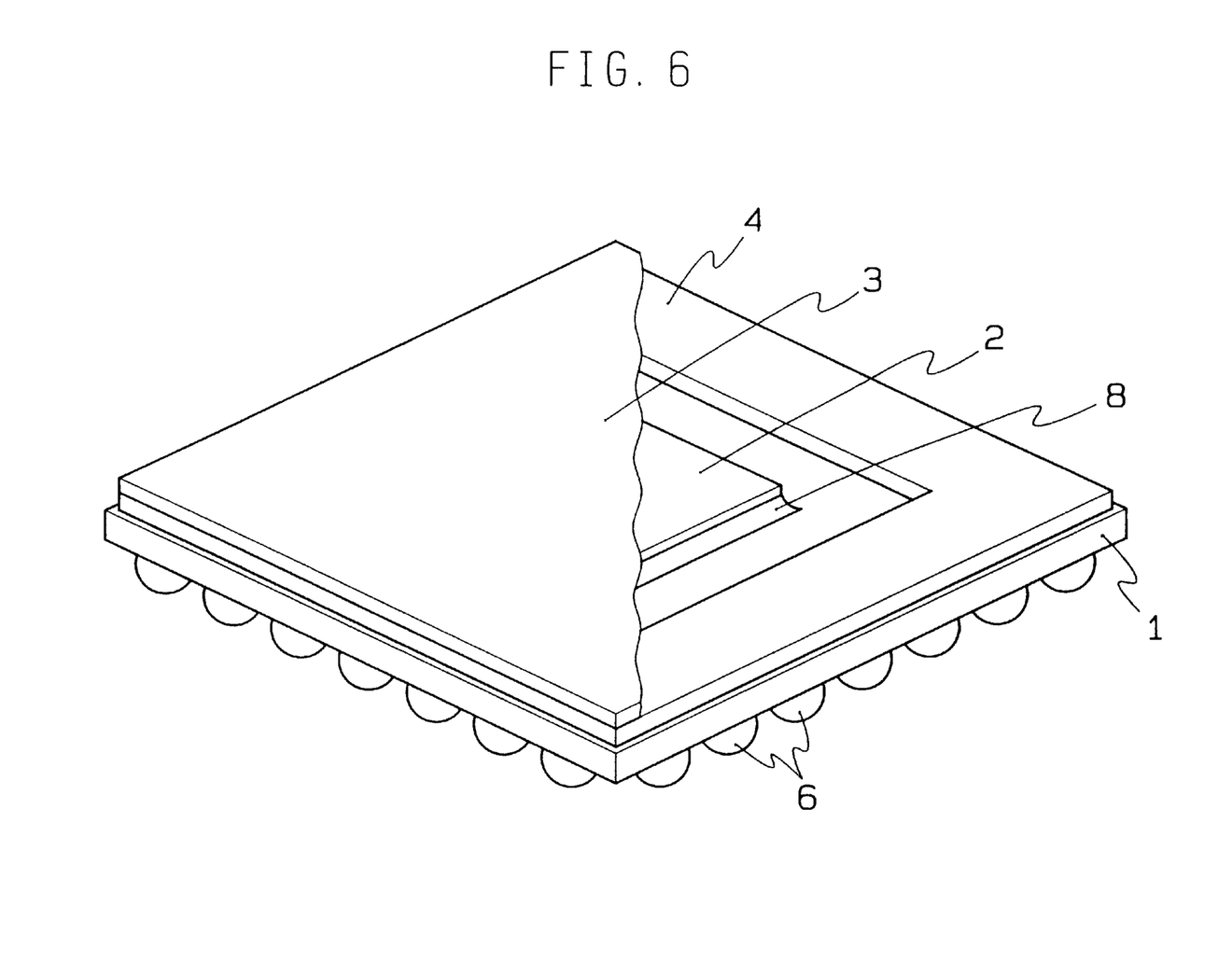
FIG. 6 is a perspective view of a partially cut-away example of the conventional semiconductor device.

FIG. 6 is a partially cut-away perspective illustrating view showing one example of the conventional semiconductor device. Referring to FIG. 6, reference numeral 1 denotes a BGA substrate, numeral 2 denotes a semiconductor chip, numeral 3 denotes a heat spreader, numeral 4 denotes a ring, numeral 6 denotes a soldering ball, and numeral 8 denotes a sealing member.

Each line (not shown) provided in the BGA substrate 1 is electrically connected with the external electrode (not shown) of the semiconductor device. The soldering ball 6, made of a soldering material, is electrically connected with the external electrode of the semiconductor device. A plurality of electrodes (not shown) of the semiconductor chip 2 are electrically connected respectively with the predetermined line of the BGA substrate 1. For example, a soldering bump is provided beforehand on the surface of the external electrode connected with each electrode surface of the semiconductor chip 2 and each line of the BGA substrate 1. The connection is realized through the soldering operation by using the solder bump. The sealing member 8, made of sealing resin, is provided for adhering the semiconductor chip 2 to the BGA substrate 1. That is, sealing member 8 prevents breaking in the connecting portion between the wiring of the BGA substrate 1 and the electrode of the semiconductor chip 2 caused due to the camber or the like of the BGA substrate 1.

In the ring 4, an opening is provided in the center of the plate-shaped member. The shape of the opening portion is determined in accordance with the shape of the semiconductor chip 2. The shape of the heat spreader 3 is a thin plate which is similar to that of the BGA substrate 1. The semiconductor chip 2 and the heat spreader 3, the BGA substrate 1 and the ring 4, and the heat spreader 3 and the ring 4 are bonded respectively with adhesives. Adhesives for bonding the semiconductor chip 2 with the heat spreader 3 is, for example, a thermally conductive silicon adhesives. Adhesives for bonding the BGA substrate 1 with the ring 4, and the heat spreader with the ring 4 is, for example, a taper shaped thermosetting adhesive or thermoplastic adhesives.

Then, a method of manufacturing the semiconductor device will be described. FIGS. 7(a) to 7(d) and FIGS. 8(a) to 8(c) respectively depict a process sectional illustrating view showing one example of the method of manufacturing the conventional semiconductor device. Referring to FIGS. 7(a) to 7(d) and FIGS. 8(a) to 8(c), the same reference numerals are used as the same components as those of FIG. 6. Reference numeral 5a denotes a first solder bump electrically connected with an electrode (not shown) to be included in the semiconductor chip 2. Numeral 5b denotes a second solder bump electrically connected with each one-end portion (not shown) of a plurality of lines provided in the BGA substrate. Numeral 7a shows a first adhesives layer composed of adhesives for bonding the BGA substrate 1 with the ring 4, and the heat spreader 3 with the ring 4. Numeral number 7b denotes a second bonding layer comprising a bonding agent for bonding the semiconductor chip 2 with the heat spreader 3.

Figure 7A:
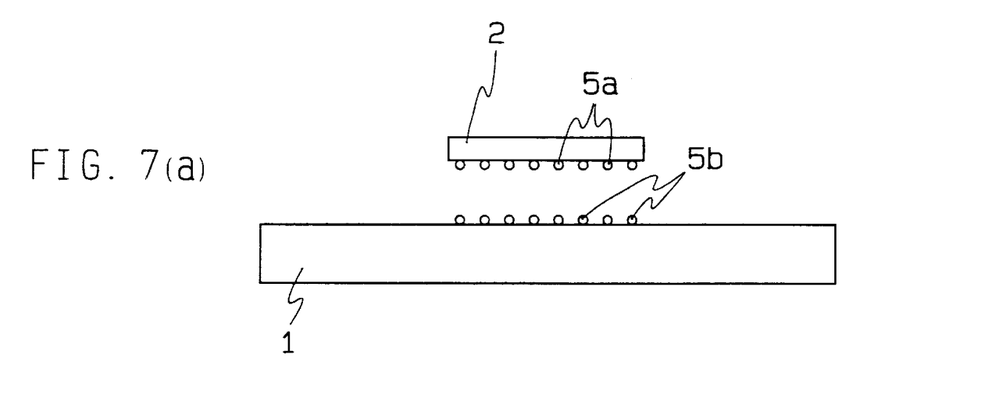
FIGS. 7(a) to 7(d) are sectional views showing one example of manufacturing the conventional semiconductor device.
Figure 7B:
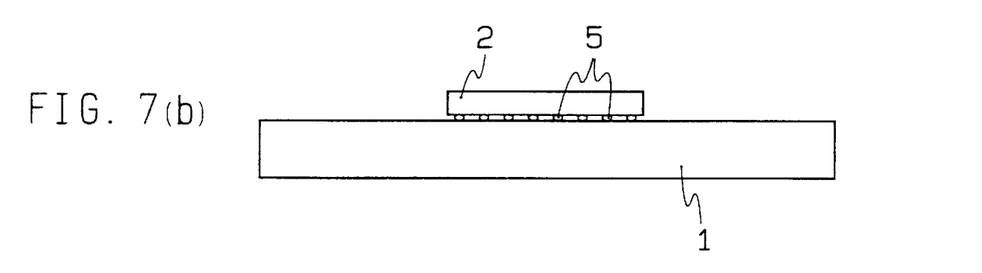
Figure 7C:
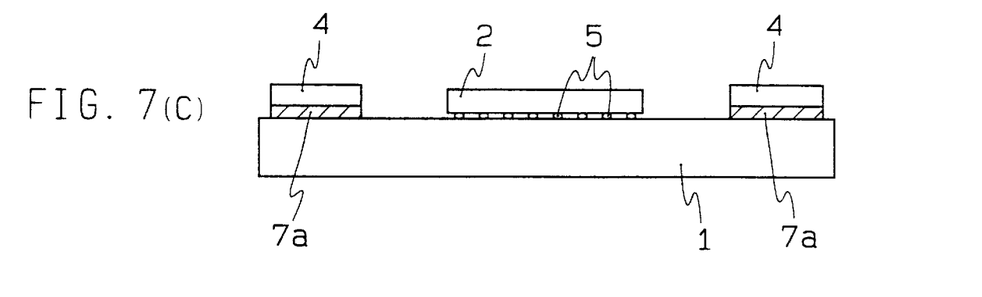
Figure 7D:
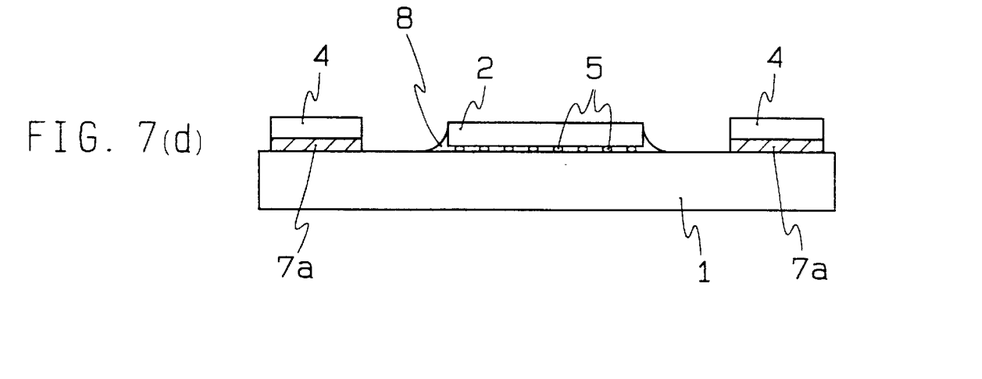

The first soldering bump 5a is provided on the electrode included in the semiconductor chip 2. Similarly, the second soldering bump 5b is provided (see FIG. 7(a)) on each one end portion of a plurality of lines of the BGA substrate 1. A flux material is applied on the area, where the second soldering bump 5b is formed, of the surface of the BGA substrate 1. A semiconductor chip 2 is placed on the BGA substrate 1, and the BGA substrate 1 and the semiconductor chip 2 are charged into a thermally processing furnace (so-called reflow furnace) with the first soldering bump 5a and the second soldering bump 5b being in contact with each other. As a result, the first soldering bump 5a and the second soldering bump 5b are melted. Thereafter, the first soldering bump 5a and the second soldering bump 5b in contact with each other are integrated. In FIGS. 7(a) to 7(b), the first soldering bump and the second soldering bump which are integrated with each other serve as a soldering bump 5. The electrode to be included in the semiconductor chip 2 is electrically connected (see FIG. 7(b)) with a plurality of lines of the BGA substrate 1. After the flux material has been washed, the ring 4 is bonded (see FIG. 7(c)) with the BGA substrate 1 by the first adhesives layer 7a.

After synthetic resin for sealing has been injected into a gap portion between the BGA substrate 1 and the semiconductor chip 2, and subjected to thermosetting to form a sealing member 8, so as to fix the semiconductor chip 2 with the semiconductor chip 2 being adhered on the BGA substrate through the sealing member 8. A second bonding layer 7b is provided (FIG. 8(a)) by applying the adhesives on the surface of the semiconductor chip 2. The first bonding layer 7a is provided by applying the adhesives on the surface of the ring 4. Then, the heat spreader 3 is placed on the semiconductor chip 2 and the ring 4, so as to bond the heat spreader 3 on the semiconductor chip 2 and the ring 4 (see FIG. 8(b)). Finally, a soldering ball 6 is provided on the external electrode of the semiconductor device connected with the other terminal portion of a plurality of lines of the BGA substrate, so as to obtain the semiconductor device (see FIG. 8(c)).

In a process of manufacturing the conventional semiconductor device is a process including a thermal processing for connecting a plurality of lines of the BGA substrate with the semiconductor chip electrode by using, for example, a first soldering bump and a second soldering bump. Generally, the BGA substrate and the semiconductor chip are different in thermal expansion coefficient, so that camber is sometimes caused in the BGA substrate during the thermal processing. Therefore, the first soldering bump and the second soldering bump which have been opposed to each other before the thermal processing step are opposed to each other no more during the thermal processing process. As a result, there is caused such a problem that electric connection is not connected between a plurality of lines of the BGA substrate and the electrode of the semiconductor chip.

On the other hand, some unevenness exists on the BGA substrate surface and the semiconductor chip surface. When a soldering material is printed on a plurality of lines of the BGA substrate or the electrode of the semiconductor chip through the mask, so as to form the first soldering bump or the second soldering bump, the mask is not sometimes adhered with the lines or the electrodes. As a result, the size of the first soldering bump or the second soldering bump becomes unequal, thereby causing such a problem that the electric connection is not retained, between the line of the BGA substrate and the electrode of the semiconductor chip.

Accordingly, an object of the present invention is to provide a semiconductor device which can retain the electric connection, even after the thermal processing process, between the line of the BGA substrate and the electrode of the semiconductor chip.

SUMMARY OF THE INVENTION

A semiconductor device according to the present invention, comprises:
   a multi-layered BGA substrate provided with a plurality of lines; and
   a semiconductor chip having a plurality of electrodes respectively connected with the plurality of lines by using the plurality of soldering bumps;
   wherein the soldering bump provided on the peripheral edge portion of the semiconductor chip is larger in size than that of a soldering bump provided in the central portion of the semiconductor chip.

A method for forming a soldering bump on a plurality of conductive members provided on the substrate surface, using a mask having a predetermined opening comprises the steps of
   placing on the substrate surface a mask thicker enough to follow the unevenness of the substrate surface;
   forming a soldering bump by printing a soldering material on each conductive member through the mask.

In a method of forming a soldering bump of the present invention is to form the soldering bump on a plurality of conductive members provided on the substrate surface, by using a mask having a predetermined opening, the opening provided on the peripheral edge portion of the masks is larger in opening size than the opening provided on the central portion of the mask.

A method of forming the soldering bump according to the present invention is to provide a soldering bump on the conductive member surface after a plurality of conductive members provided on the substrate surface and the semiconductor chip surface are formed on a concave surface.

DETAILED DESCRIPTION OF THE INVENTION

A method of forming a soldering bump of this invention, and an embodiment of the semiconductor device to be manufacturing by this method will be described.

Embodiment 1

A method of forming a soldering bump of this invention and an embodiment 1 of the semiconductor device manufactured by this method will be described with reference to the drawings.

Figure 1:
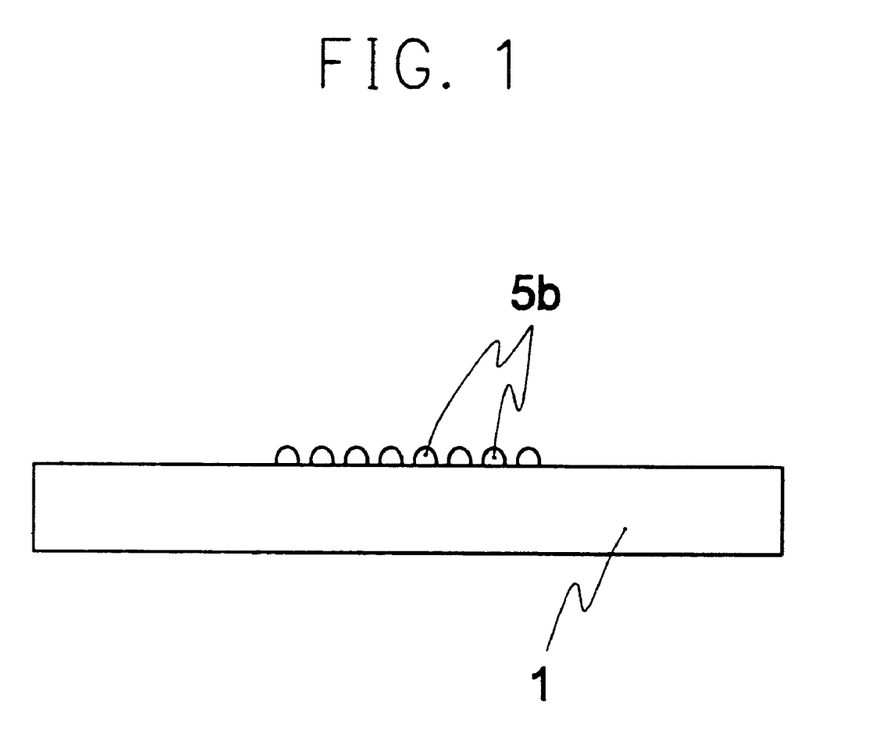
FIG. 1 is a view showing a BGA substrate and a second soldering bump in one embodiment of a method of forming a soldering bump of the present invention.
Figure 8A:
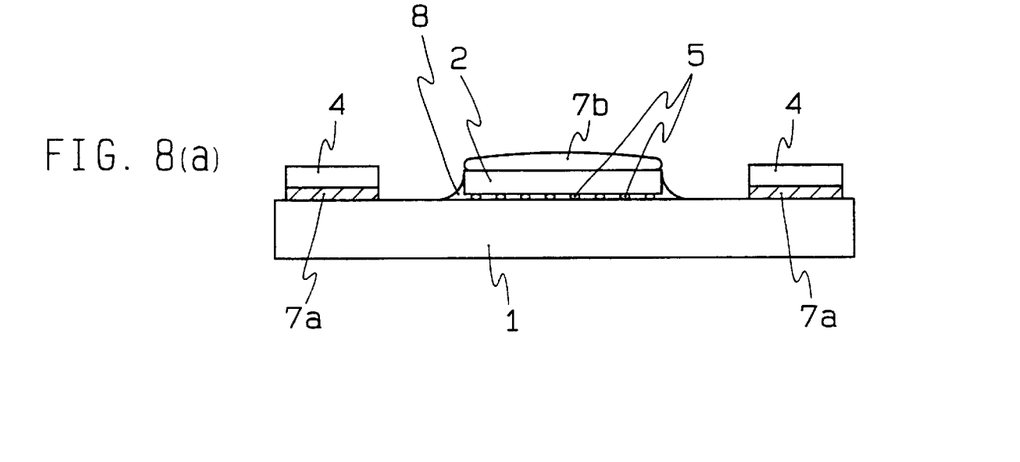
FIGS. 8(a) to 8(c) are sectional views showing another example of manufacturing the conventional semiconductor device.
Figure 8B:
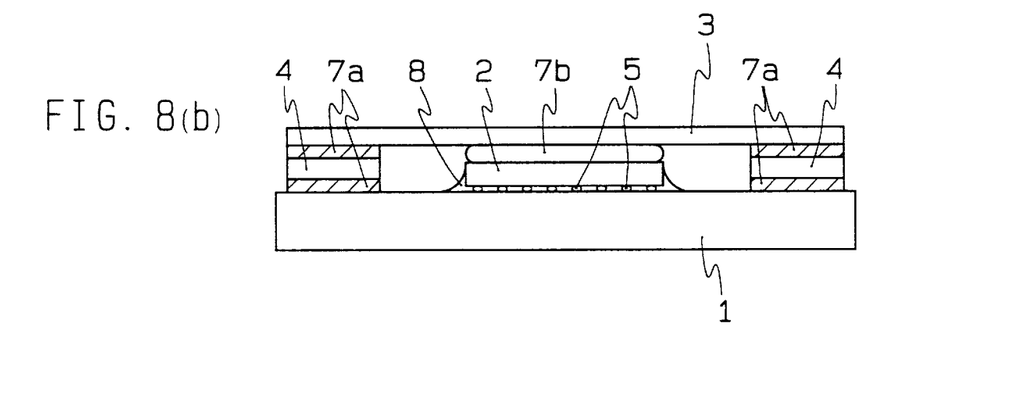
Figure 8C:
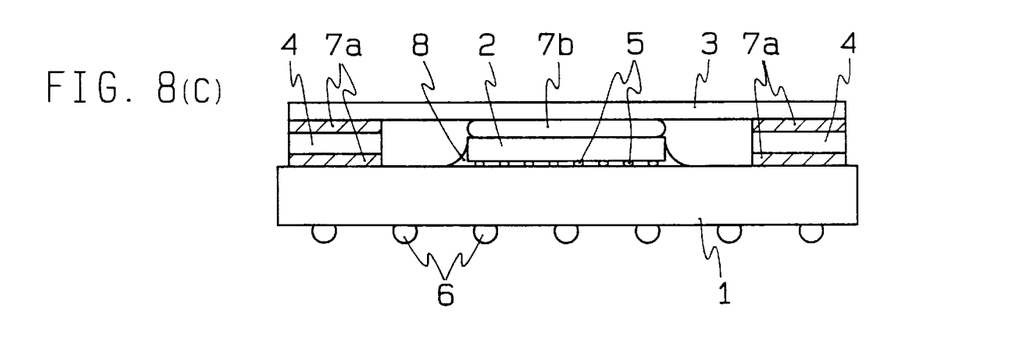

FIG. 1 is an illustrating view showing a BGA substrate and a second soldering bump in one embodiment of a method forming the soldering bump of the present invention. In FIG. 1, the same reference numerals are used about same locations as those of FIG. 7 and FIG. 8. For easier understanding, a plurality of wirings to be included in the BGA substrate are not shown.

In this embodiment, a mask having a given opening is used when the second soldering bump 5b is formed on a plurality of lines (a plurality of conductive members) of the BGA substrate. A plurality of openings are provided and are respectively oppositely provided in one end portion of the line of the substrate when the mask is placed on the surface of the BGA substrate.

In a method of forming the second soldering bump, a mask is placed on the surface of the BGA substrate. Then, a second soldering bump 5b can be formed in a predetermined position by printing a soldering material on the electrode through the mask while the mask is being pressed on the surface of the BGA substrate.

The mask is composed of a metal plate thick enough to follow the unevenness (not shown) of the BGA substrate. As an example of a mask material is, for example, nickel. The thickness of the mask is, for example 30 through 50 $\mu$m. When the total of the depth of the unevenness and the height of the convex of the BGA substrate surface is 10 through 20 $\mu$m, the mask can follow the unevenness of the BGA substrate by making the thickness of the mask 40 $\mu$m, because the mask has such elastic flexibility as to follow the unevenness of the BGA substrate, and can be deformed in accordance with the unevenness.

The mask can be followed to the unevenness of the BGA substrate by adjusting the tension applied upon the mask when the mask is placed on the surface of the BGA substrate, because the flexibility can be adjusted. When the semiconductor device has been formed by using the soldering bump forming method of the present invention, the soldering bump can be provided with a pitch of 0.3 mm or lower. Therefore, many lines can be provided with the BGA substrate, and plural electrodes can be provided with the semiconductor chip. The pitch is a distance between central points in the area where the second soldering bumps of the line surface of the BGA substrate come into contact with each other in the adjacent two second soldering bumps.

In the present embodiment, a BGA substrate is shown as one example of the substrate forming the soldering bump. But it is not restricted to this substrate. The method of forming the soldering bump of the present invention can be used even when the first soldering bump is formed in the electrode of this semiconductor chip.

Embodiment 2

The embodiment 2 of the method of forming of the soldering bump of the present invention and the semiconductor manufactured by using this method will be described with reference to the drawings.

Figure 2:
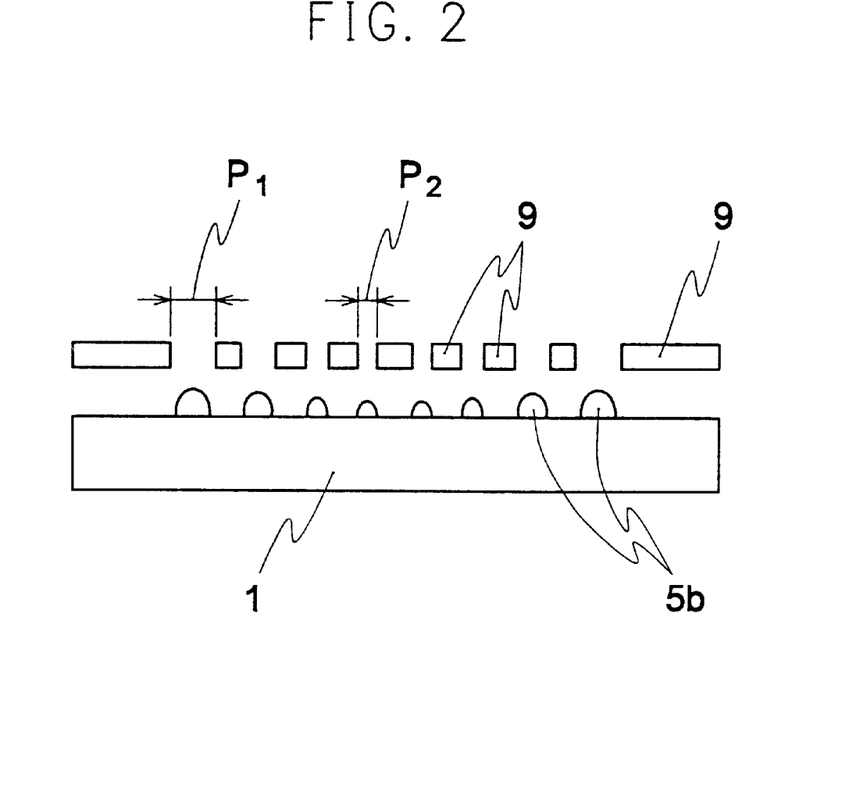
FIG. 2 is a view showing a BGA substrate and a second soldering bump and a second soldering bump in another embodiment of a method of forming a soldering bump of the present invention.

FIG. 2 is an illustrating view showing the BGA substrate and the second soldering bump in another embodiment of the method of forming the soldering bump of this invention. Referring to FIG. 2, the same reference numerals are used for the same locations of those in FIG. 1. Reference numeral 9 denotes a mask. For easier understanding, a plurality of lines to be included in the BGA substrate are not shown.

In the present embodiment, a mask is used where the size of the opening of the mask shown in the embodiment 1 is made different depending upon locations. That is, the size P1 of the opening provided in the peripheral portion of the mask 9 is made larger than the size P2 of the opening to be provided in the central portion of the mask 9. The size P1 or the size P2 shows a diameter when the shape of the opening is circular and one side length when the shape of the opening is square. Regardless of the shape of the opening, the area of the opening can be a size. In FIG. 2, the size P1 or the size P2 shows the diameter.

The thermal expansion factor difference between the semiconductor chip and the BGA substrate determines how much different the size P1 or the size P2 is made.

Figure 3:
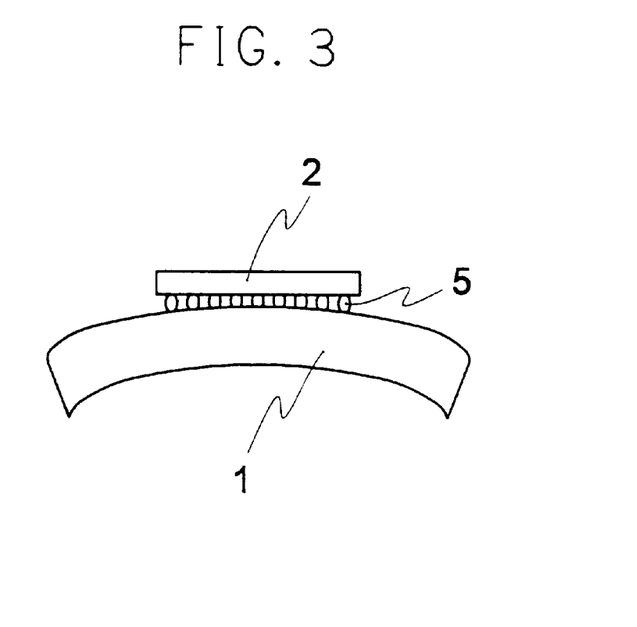
FIG. 3 is a view showing a semiconductor device formed by using a mask of FIG. 2.

FIG. 3 is an illustrating view showing the semiconductor device formed by using a mask of FIG. 2. For easier understanding, FIG. 3 shows only the BGA substrate 1, the semiconductor chip 2 and the soldering bump 5.

When the thermal expansion coefficient of the BGA substrate 1 is larger than that of the semiconductor chip 2 to cause camber in the BGA substrate in the thermal processing step, the space between the BGA substrate 1 and the semiconductor chip 2 becomes larger in the peripheral portion of the semiconductor chip 2. By using the mask, the soldering bump 5 provided in the peripheral portion of the semiconductor chip can be made larger in size than the soldering bump 5 provided in the center portion of the semiconductor chip. Therefore, when the space between the BGA substrate 1 and the semiconductor chip 2 changes in location, the electric connection between a plurality of lines of the BGA substrate and the electrode of the semiconductor chip.

Embodiment 3

The embodiment 3 of the method of forming the soldering bump and the semiconductor device manufactured by using this method will be described with reference to the drawings.

Generally, the thermal expansion coefficient of the BGA substrate is different from that of the semiconductor chip. Thus, when the semiconductor device is formed, two conductive members which are opposed to each other before the thermal processing step becomes opposite no more during the thermal processing step.

Figure 5A:
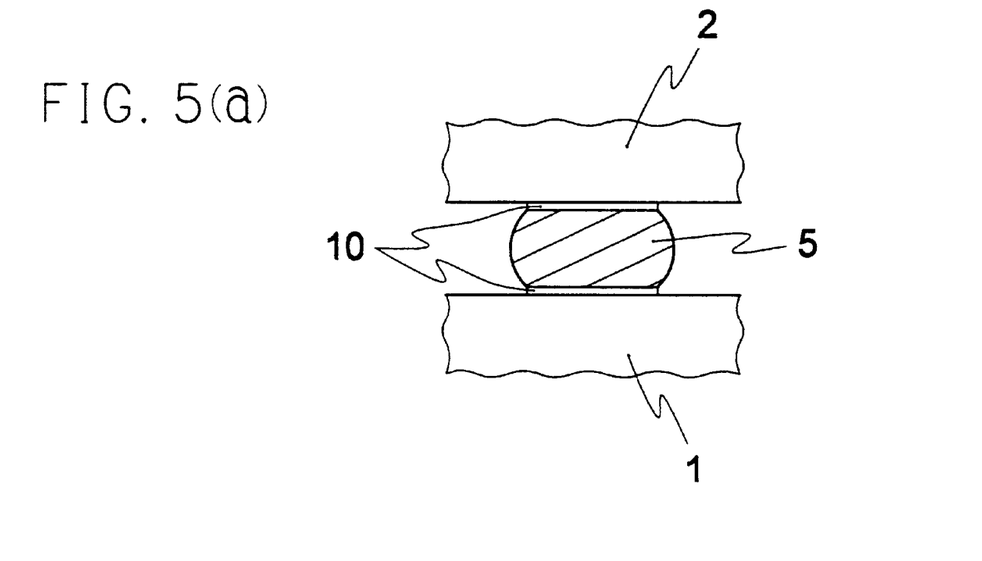
FIGS. 5(a) and 5(b) are illustrating views of a partial enlargement showing the soldering bump and its surrounding portion in a conventional semiconductor device.
Figure 5B:
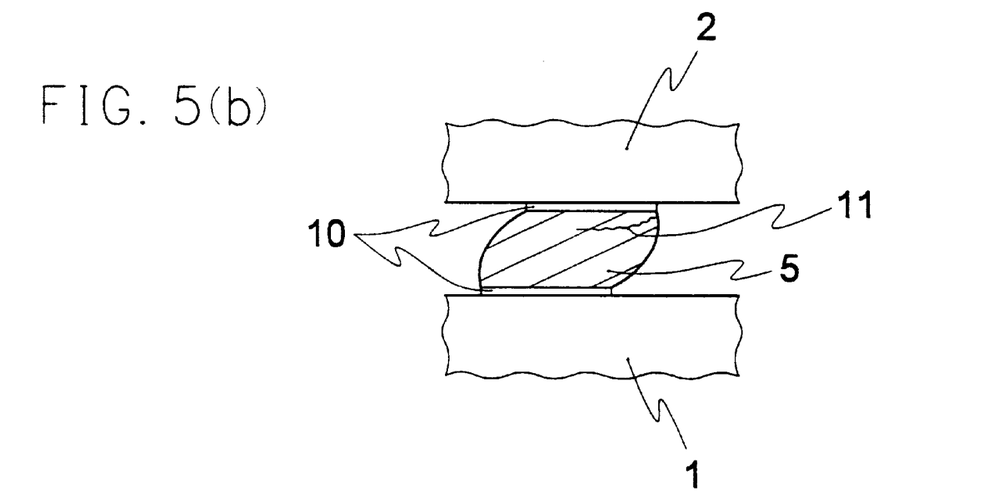

FIGS. 5(a) and 5(b) are partial enlargement illustrating view of the soldering bump and its peripheral portion of the conventional semiconductor device. FIG. 5(a) show the soldering bump prior to the thermal processing step. FIG. 5(b) shows the soldering bump after the thermal processing step. Referring to FIG. 5, numeral 1 denotes a BGA substrate, numeral 2 denotes a semiconductor chip, numeral 5 denotes a soldering bump and numeral 10 denotes a conductive member. The conductive member 10 is a part of the lines of the BGA substrate to which the soldering bump connected. That is, the conductive member is provided on the surface of the BGA substrate and the semiconductor chip surface. For easier understanding, the location except for the semiconductor member of the wiring of the BGA substrate, and the electrode of the semiconductor chip are not shown.

As shown in FIG. 5(b), when two conductive members are opposed no more, one portion of the soldering bump 5 is pulled to cause the crack 11. As a result, the electric connection between a plurality of lines of the BGA substrate and the electrode of the semiconductor chip cannot be retained.

Figure 4:
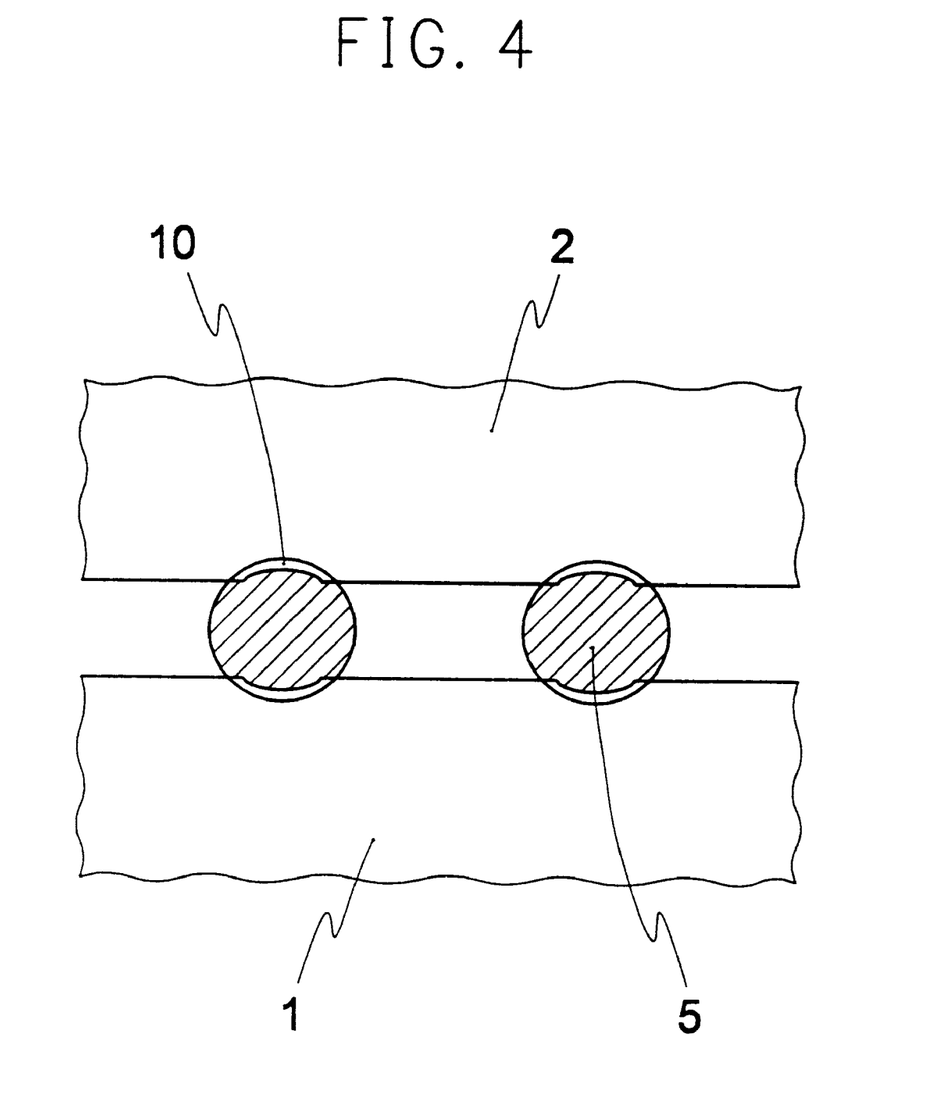
FIG. 4 is a view of a partial enlargement showing the soldering bump and its surrounding portion in the still another embodiment of the semiconductor device of the present invention.

FIG. 4 is a partial enlargement illustrating view showing the soldering bump and a portion surrounded thereby in still another embodiment and its peripheral portion in the semiconductor apparatus of this invention. Referring to FIG. 4, reference numeral 1 is a BGA substrate, numeral 2 is a semiconductor chip, numeral 5 is a soldering bump and numeral 10 is a conductive member.

In the embodiment of the present invention, the shape of the semiconductor member 10 is concave. Thus, the shape of the soldering bump 5 can be more spherical than that of the soldering bump 5 to make it difficult to cause the cracks shown in FIG. 5(b). As a result, the electric connection between a plurality of lines of the BGA substrate and the electrodes of the semiconductor chip.

In soldering the semiconductor device to the embodied substrate, the conductive member on which the soldering ball of the semiconductor device is provided and the conductive member on which the soldering ball of the embodied substrate are respectively concave, so as to obtain similar effect to the soldering ball on the embodied substrate.

A semiconductor device according to the present invention, comprises: a multi-layered BGA substrate provided with a plurality of lines and,   a semiconductor chip having a plurality of electrodes respectively connected with a plurality of line,   wherein the soldering bump provided on the peripheral edge portion of the semiconductor chip is larger in size than that of a soldering bump provided in the central portion of the semiconductor chip. Therefore, even after the thermal processing operation has been conducted, the electric connection between a plurality of wirings of the BGA substrate and the electrodes of the semiconductor chip can be retained.

A method of forming a soldering bump on a plurality of conductive members provided on the substrate surface, using a mask having a predetermined opening comprises:

placing on the substrate surface a mask thicker enough to follow the unevenness of the substrate surface; and   forming a soldering bump by printing on each conductive member through the mask. Therefore, plural lines or electrodes can be provided by the BGA substrate and the semiconductor chip.

In a method of forming a soldering bump the soldering bump is formed on a plurality of conductive members provided on the substrate surface, using a mask having a predetermined opening, the opening provided on the peripheral edge portion of the masks being larger in opening size than the opening portion provided in the central portion of the mask. Therefore, even after the thermal processing operation has been conducted, the electric connection between a plurality of lines of the BGA substrate and the electrodes of the semiconductor chip can be retained.

A method of forming the soldering bump according to the present invention is to provide a soldering bump on the conductive member surface after a plurality of conductive members provided on the substrate surface and the semiconductor chip surface are formed concave shaped, thus preventing cracks in the soldering bump.

Though several embodiments of the present invention described above, it is to be understood that the present invention is not limited to the above-mentioned embodiments, and various changes and modifications may be made in the invention without departing from the spirit and scope thereof.

What is claimed is:

1. A semiconductor device comprising:
   a multi-layered ball grid array (BGA) substrate including a plurality of lines;
   a semiconductor chip having a periphery and a plurality of electrodes; and
   a plurality of soldering bumps made of soldering material, the electrodes being respectively connected to corresponding lines through respective soldering bumps, wherein all of the soldering bumps located at the periphery of the semiconductor chip have the same size and are larger in size than the soldering bumps located in a central portion of the semiconductor chip.

2. The semiconductor device of claim 1 wherein the soldering bumps are formed by printing a soldering material on the electrodes through a mask having openings of different sizes corresponding to sizes of the soldering bumps at the periphery and central portion of the semiconductor chip.

3. A semiconductor device comprising:
   a multi-layered ball grid array (BGA) substrate having a surface and including a plurality of lines terminating at the surface at respective concavities in the surface;
   a semiconductor chip having a periphery and a plurality of electrodes including concavities; and
   a plurality of soldering bumps made of soldering material, the electrodes being respectively connected to corresponding lines through respective soldering bumps, the soldering bumps being disposed partially in the concavities of the electrodes and the surface of the substrate, wherein the soldering bumps located at the periphery of the semiconductor chip are larger in size than the soldering bumps located in a central portion of the semiconductor chip.

* * * * *